United States Patent [19]
Inoue

[11] Patent Number: 5,833,481
[45] Date of Patent: Nov. 10, 1998

[54] MULTI-TAP DISTRIBUTION APPARATUS

[75] Inventor: Nobutaka Inoue, Nisshin, Japan

[73] Assignee: Maspro Denkoh Co., LTT, Nisshin, Japan

[21] Appl. No.: 836,955

[22] PCT Filed: Jul. 24, 1996

[86] PCT No.: PCT/JP96/02110

§ 371 Date: May 22, 1997

§ 102(e) Date: May 22, 1997

[87] PCT Pub. No.: WO97/13323

PCT Pub. Date: Apr. 10, 1997

[30] Foreign Application Priority Data

Sep. 30, 1995 [JP] Japan ................................. 7-276304

[51] Int. Cl.⁶ ..................................................... H01R 13/15
[52] U.S. Cl. ............................................ 439/263; 439/579
[58] Field of Search ........................................ 439/263, 727, 439/76.1, 728, 535, 579; 174/135, 65 G, 151, 153 G

[56] References Cited

U.S. PATENT DOCUMENTS

| 3,951,490 | 4/1976 | Devendorf | 439/814 |
| 4,226,495 | 10/1980 | Palle et al. | 439/535 |

FOREIGN PATENT DOCUMENTS

| 52-55962 | of 1977 | Japan . |
| 62-196435 | of 1987 | Japan . |
| 63-20156 | of 1988 | Japan . |
| 63-25801 | of 1988 | Japan . |
| 8181559 | of 1996 | Japan . |

*Primary Examiner*—Neil Abrams
*Assistant Examiner*—T. C. Patel
*Attorney, Agent, or Firm*—Pearson & Pearson

[57] ABSTRACT

There is provided a multi-drop distribution apparatus capable of securely connecting a transmission cable thereto without opening a case and of allowing safe transmission of large currents. A housing (1) has formed on its inner wall block securing recesses (9b). A split tube (8) provided on an end of a transmission line is gripped in a pair of grip blocks (9) each having a support groove (9a) on a split surface. The grip blocks (9) are disposed in a block securing recesses (9b) and secured by tightening a screw (9c) at a side through a screw access hole (3c).

7 Claims, 12 Drawing Sheets

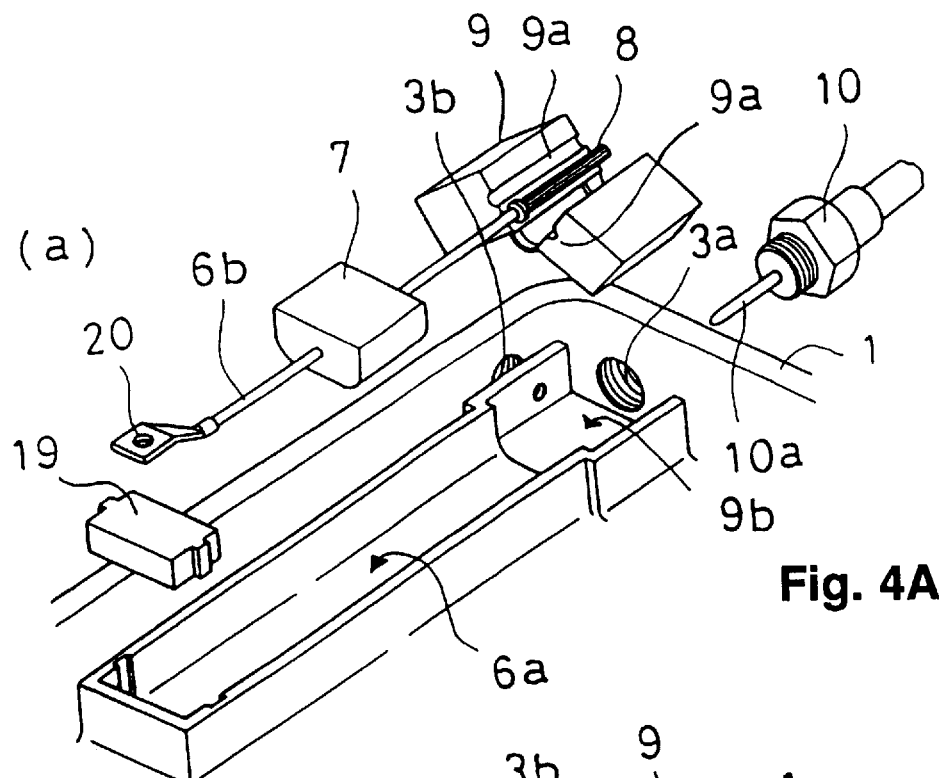
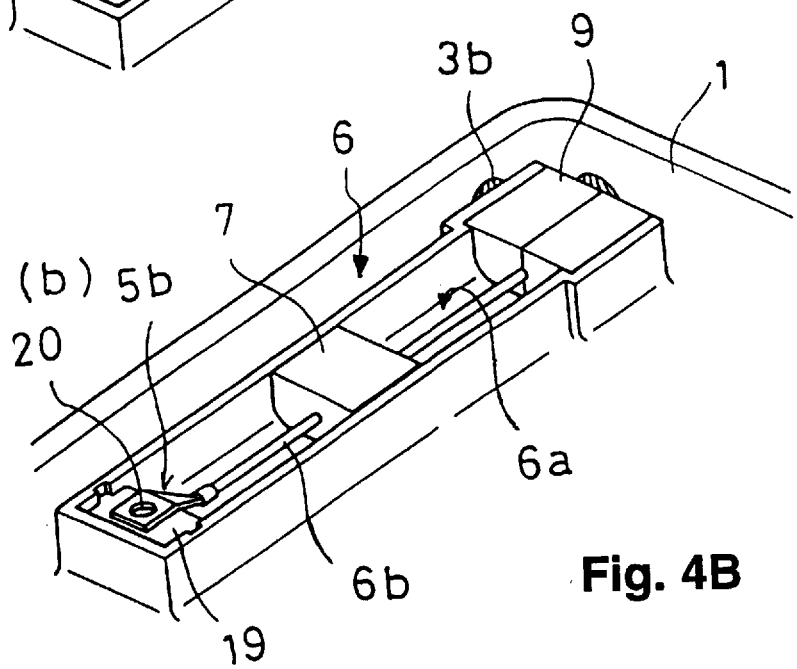
Fig. 4A
Fig. 4B

MULTI-TAP DISTRIBUTION APPARATUS

FIELD OF THE ART

The present invention relates to a multi-tap distribution apparatus. More particularly, the present invention relates to a multi-tap distribution apparatus which is suitable for use with CATV cables.

BACKGROUND ART

Generally, CATV transmission cables are connected to subscribers via multi-tap distribution apparatuses. CATV stations transmit through the cables not only television signals and control signals but also currents for operating main line amplifiers.

While some distribution apparatuses are not designed for passing currents, there are those designed for this purpose. The later type of distribution apparatuses are provided with a current transmission circuit either installed in the route from a cable connecting portion to taps via a branch circuit and a distribution circuit.

Conventionally, a connector pin provided on one end of the cable is inserted into a terminal, such as one comprising a split tube, in order to connect the cable to the distribution apparatus.

Because the cable connecting portions of the distribution apparatus carry the same maximum currents as the main line does, they must be securely connected to the cable. For the same reason, the cable connecting portions must have a sufficient capacity to minimize the transmission loss. Also, they must be designed not to affect the characteristics of the electromagnetic waves.

While the aforementioned pin-to-split tube type connection is easy to handle, the contact area tends to generates heat when carrying a current of high amperage. It is, therefore, preferable to secure the central conductor of the cable to a cable connecting portion with a screw. Tightening a screw, however, requires a complicated procedure including the steps of, for example, opening the case of the multi-tap distribution apparatus and fitting the central conductor between a pair of holding plates or winding it around a screw. Such a procedure may be dangerous when carried out on an aerial type apparatus in an elevated position.

DISCLOSURE OF THE INVENTION

The present invention provides a distribution apparatus for being interposed in a transmission cable. The distribution apparatus includes a built-in mother board disposed in the approximate center of a case. The mother board includes a branch circuit for distributing as output signals high-frequency signals received at an input terminal of the mother board, a current transmission circuit for allowing currents to be transmitted between the input terminal and an output terminal of the mother board, and the input and output terminals of the mother board being electrically connected to cable connecting portions provided on corners of the case by means of transmission lines. In the apparatus, a pair of grip blocks are positioned in each cable connecting portion. Each pair of grip blocks grips and supports an end portion of a split tube secured to one end of the transmission line with an open end of the split tube directed to one of connector insertion holes formed in the case. Furthermore, one of each pair of blocks are provided with a screw for being tightened in the direction for gripping the split tube. Screw access holes are formed in walls of the case.

According to one aspect of the present invention, at least three cable connecting portions are provided so that two cable connecting portions are selectable from the at least three cable connecting portions for connection to the mother board.

According to another aspect of the present invention, support grooves are formed in the surfaces of the grip blocks that come into contact with the split tube.

According to still another aspect of the present invention, the screw access holes are plugged with blind bolts.

BRIEF DESCRIPTION OF THE DRAWINGS

FIGS. 4A and 4B show the transmission line of the embodiment.

BEST MODE FOR CARRYING OUT THE INVENTION

A multi-tap distribution apparatus embodying the present invention will be explained with reference to the attached drawings. The multi-tap distribution apparatus of the embodiment is provided with three cable connecting portions so as to be used as either an aerial type or pedestal type device. Also, the number of taps can be changed in the distribution apparatus of this embodiment.

Figure 1:
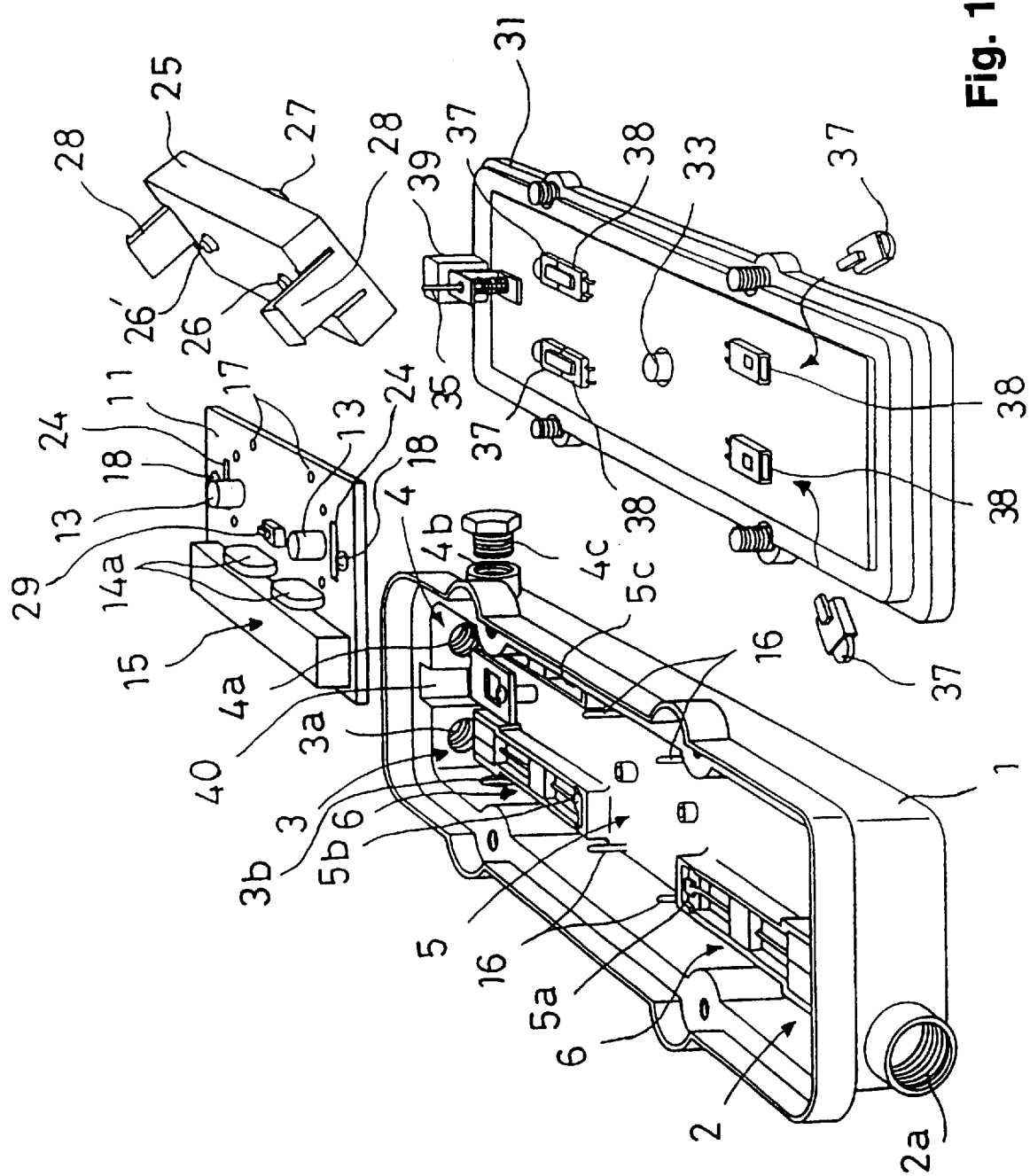
FIG. 1 is an exploded perspective view of a multi-tap distribution apparatus of an embodiment of the present invention.
Figure 2:
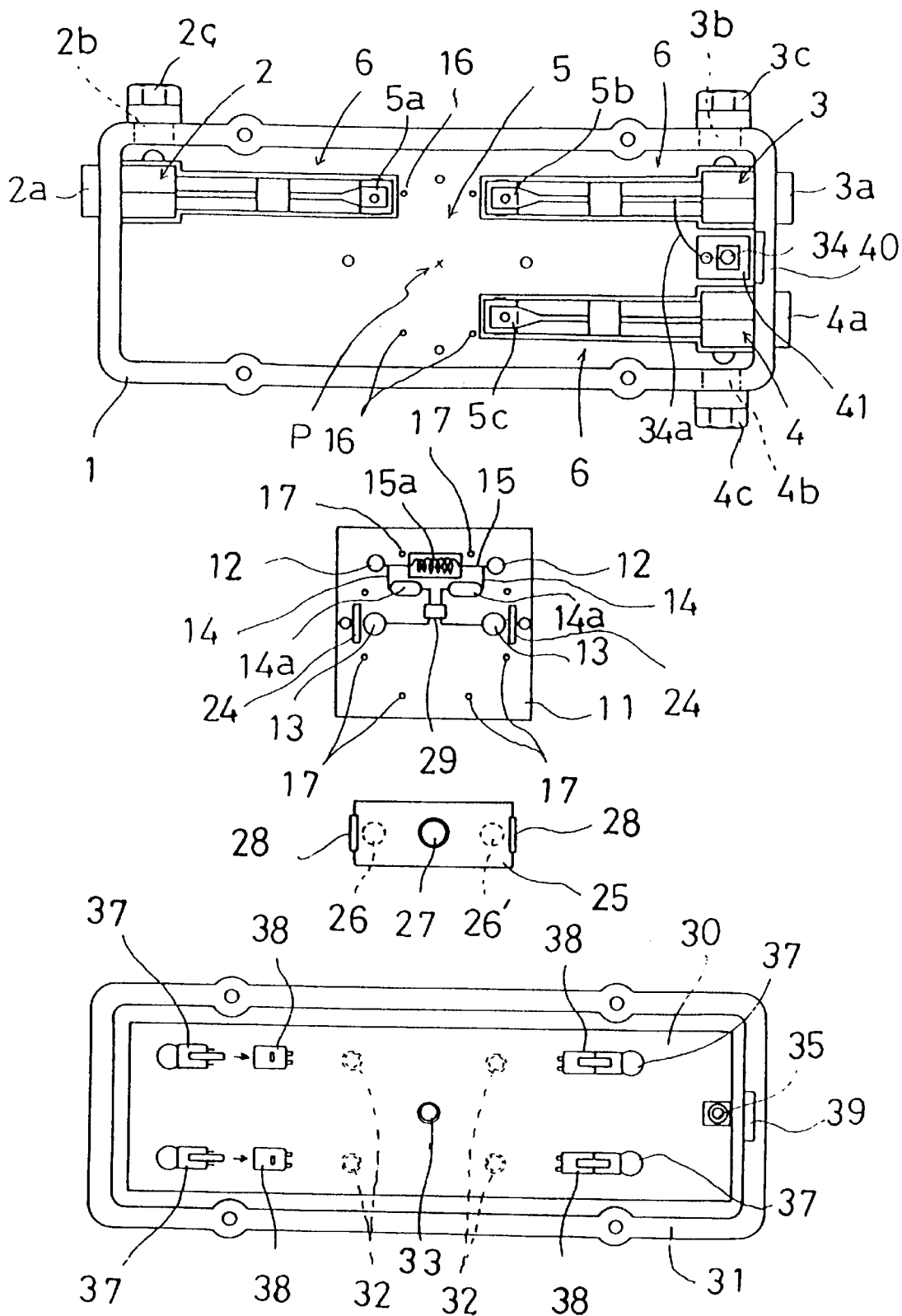
FIG. 2 shows a plan view of the components of the multi-tap distribution apparatus.
Figure 3:
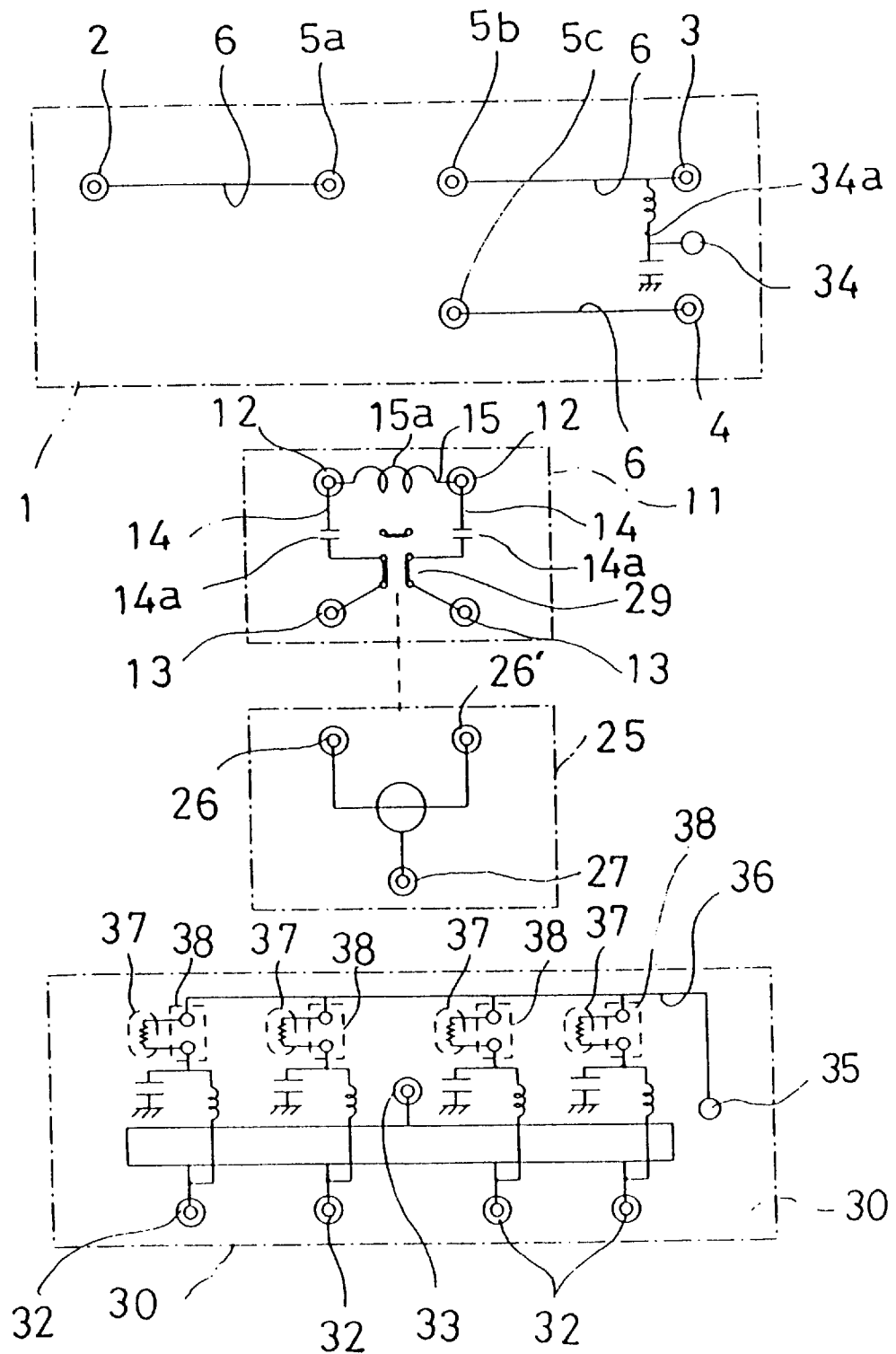
FIG. 3 shows a circuit diagram of the components of the multi-tap distribution apparatus.

Referring to FIGS. 1 to 3, numeral 1 designates a box-shaped housing made of die-cast aluminum with one side open. The housing 1 (one of the two components forming the entire case) is provided with one cable connecting portion 2 on one end surface and two other cable connecting portions 3 and 4 on the opposite end surface. Each of the cable connecting portions 2, 3, and 4 is disposed on a corner of the housing 1. Connector insertion holes 2a, 3a, and 4a are provided in the end surfaces while three screw access holes 2b, 3b, and 4b are provided in the longitudinal sides of the housing 1. The screw access holes 2b, 3b, and 4b are closed with blind bolts 2b, 3b, and 4b.

The housing 1 has in its center a circuit mounting area 5 on which three main line connection terminals 5a, 5b, and 5c are provided. The upper terminals 5a and 5b are located above, and on the right and left sides of, the center P of the housing 1 while the terminal 5c is located directly under the right terminal 5b. The terminals 5a, 5b, and 5c are connected to the respective cable connecting portions 2, 3, and 4, respectively, via transmission lines 6.

Referring to FIGS. 4A and 4B, each transmission line 6 has a coaxial structure formed on the inner wall of the housing 1. The transmission line 6 includes a conductive rod 6b disposed as the central conductor in a groove 6a without being in contact with the inner wall of the groove 6a. The groove 6a has a semi-circular cross section and a shield wall erected on each side.

The transmission line 6 further includes a dielectric block 7 which is penetrated by the conductive rod 6b and mounted in the groove 6a. The dielectric block 7 has an outer shape that fits in the groove 6a and occupies part of the groove 6a so as to be slidable in the longitudinal direction of the groove 6a.

Figure 5:
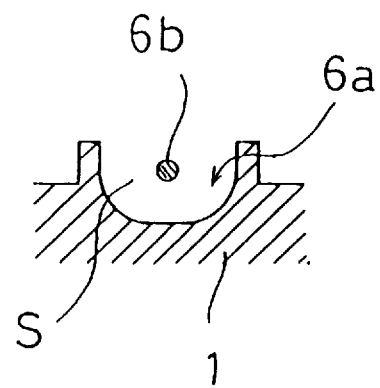
FIG. 5 is a cross sectional view of the transmission line taken on line A—A of FIGS. 4A.

Being formed on the inner wall of the case in this manner, the transmission line 6 offers the following advantages. The thickness of the conductive rod 6b can be freely changed. Referring to FIG. 5 showing a cross section taken on line A—A, each transmission line has a layer S of air between the conductive rod 6b and the inner wall of the groove 6a, which serves as the outer conductor. This structure only has a small transmission loss so that the transmission line is capable of coping with currents of high amperes. The structure also allows adjustment of the high-frequency characteristics of the transmission line by moving the dielectric block 7 along the groove.

Figure 6:
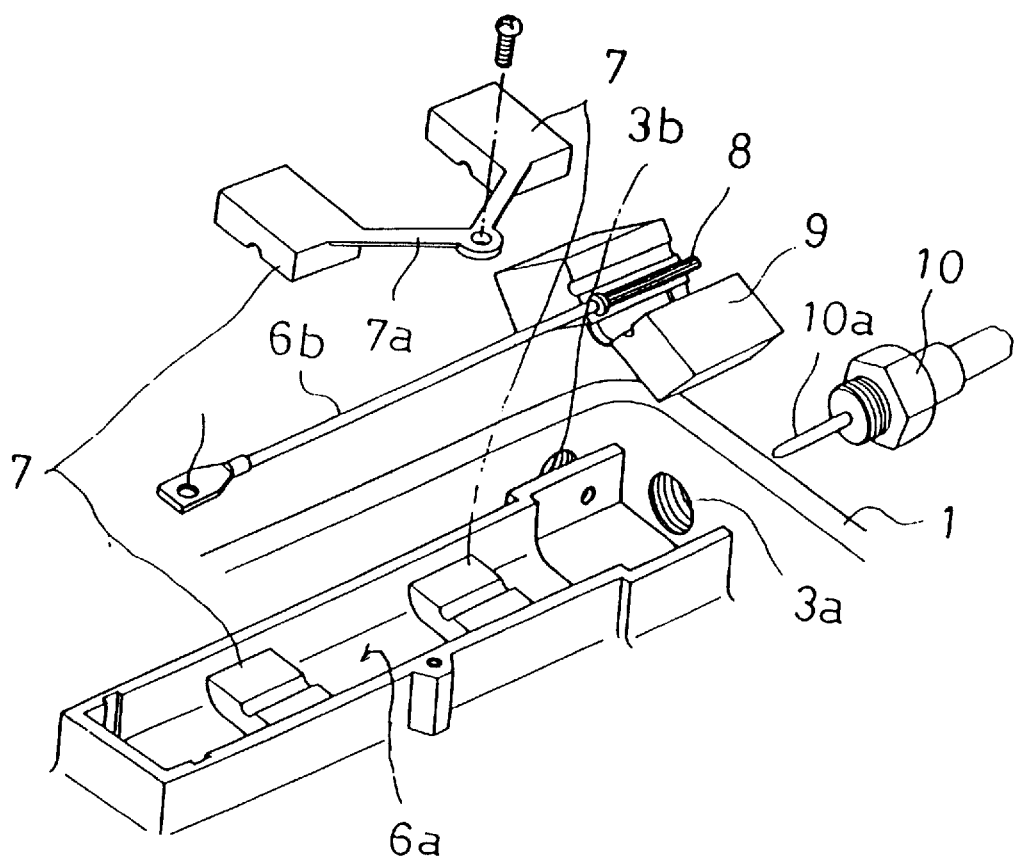
FIG. 6 shows an alternate transmission line 6 of the embodiment.

The preferred material of the dielectric block 7 is Jurakon (a brand name; manufactured by Polyplastics Corporation). Alternatively, the block may be made of some other synthetic resin with similar electrical characteristics. Depending on the application, the dielectric block 7 may be fixed in the groove 6a so as not to be slidable. Furthermore, as shown in FIG. 6, a plurality (for example, two as shown) of the dielectric blocks may be fixed in each groove 6a. As illustrated, each of the blocks 7 may be divided into two sections with the two upper sections connected by an arm 7a, so that the upper blocks can be easily mounted in the groove by securing the arm 7a to the housing 1 with a screw.

Also, a split tube 8 is secured to one end of the conductive rod 6b. The spilt tube 8 is gripped and supported by a pair of grip blocks 9 in the cable connecting portion 2 (3, 4). The grip blocks 9 are connected by a hinge. A support groove 9a is formed in the split surface of each block. Furthermore, a block securing recess 9b which is formed integrally with the groove 6a is provided in the cable connecting position on the inner surface of the housing 1.

Figure 7:
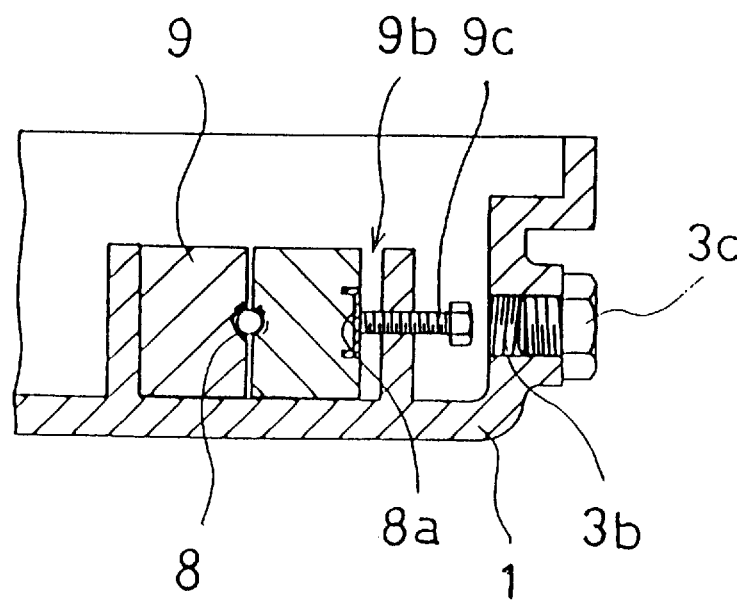
FIG. 7 is a cross sectional view of the transmission line taken on line A—A of FIGS. 4A.

For assembly, as shown in FIG. 7 which illustrates a cross section taken on line B—B, the split tube 8 is gripped in the support grooves 9a by fitting the two grip blocks 9 together. Then, the blocks 9 are positioned in the block securing recess 9b and secured by tightening a screw 9c at a side.

Then, a connector 10 attached to one end of a transmission cable is tightened into the cable insertion hole 2a (3a, 4a) while inserting a pin 10a of the connector 10 into the split tube 8. Finally, the screw 9c is tightened to firmly and securely connect the pin 10a to the split tube 8 between the grip blocks 9. This eliminates the need for fitting the central conductor between a pair of holding plates or winding it around a screw.

The screw access hole 3b (2b, 4c) is formed close to the cable connecting portion 3 (2, 4) in the longitudinal sides of the housing 1 and the case is made completely waterproof with the blind bolt 3c (2c, 4c). Also, the screw 9c can be tightened from the outside through the screw access hole 3b (2b, 4b) upon removing the blind bolt 3c (2c, 4c).

Accordingly, this construction permits connection of a cable to a cable connecting portion without opening the case. Moreover, the pin of the connector, inserted into the split tube and securely gripped in the support grooves 9a of the grip blocks, is prevented from slipping out and causes little transmission loss at the connection.

As shown in FIG. 7, a metal abutment plate 8a is mounted on one of the grip blocks 9 where the screw abuts against the block to prevent cracking or deformation of the grip block. In addition, the abutment plate 8a allows the pressure of the screw 9c to be distributed over the entire length of the grip block 9.

Reference numeral 11 is a mother board having a pair of transmission terminals 12 on its rear face and a pair of relay terminals 13 on its front face. The transmission terminals 12 are spaced apart so as to correspond with the main line connection terminals 5a and 5b (or 5b and 5c). Each of the transmission terminals 12 is connected to a relay terminal 13 via a high-frequency passing circuit 14 with a capacitor 14a interposed therein. The circuits 14 allow high-frequency signals to pass therethrough. The two transmission terminals 12 are connected to each other by a current transmission circuit 15 with a coil 15a interposed therein. The current transmission circuit 15 is also protected with a cover.

Also, the housing 1 has a plurality of guide pins 16 projected therefrom while the mother board 11 has a plurality of guide holes 17 formed therein corresponding to the guide pins 16. The mother board 11 is mounted in the housing 1 by inserting the guide pins 16 into the guide holes 17. In this way, the transmission terminals 12 are easily aligned and brought into contact with, for example, the main line connection terminals 5a and 5b, although these terminal are not visible behind the mother board 11 during mounting. Then, the mother board 11 is secured to the housing 1 with a pair of screws 18.

Also, the mother board 11 has a pair of metal screws 22a tightened through the transmission terminals 12 to firmly secure the terminals 12 to the main line connection terminals 5b (5a, 5c).

Figure 8:
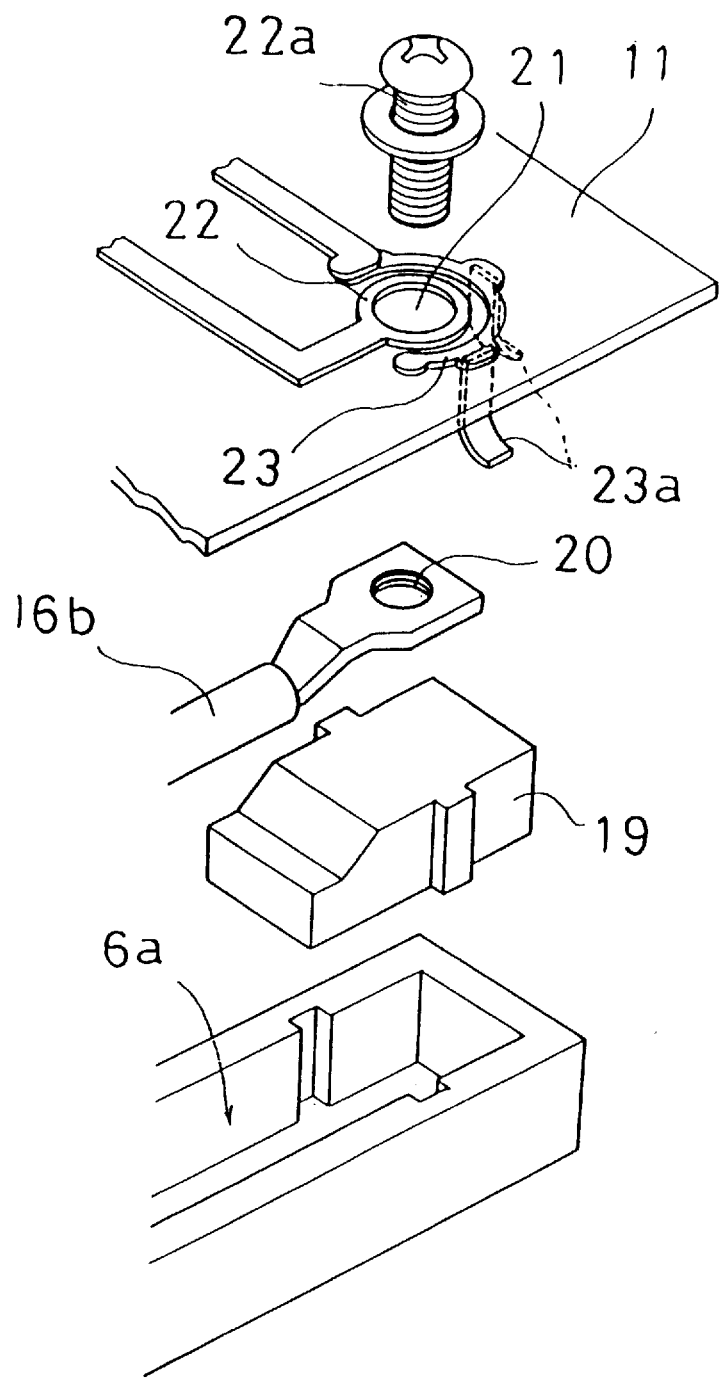
FIG. 8 shows the main line connection terminal of the embodiment.

Referring to FIGS. 4A and 4B, each of the main line connection terminals 5a, 5b, and 5c includes a resin support piece 19 provided at one end of the groove 6a and an end portion of the conductive rod 6b placed on the support piece 19. The end portion of the rod 6b has a threaded hole 20 formed therethrough. As shown in FIG. 8, the transmission terminal 12 includes a first land 22 surrounding a screw hole 21 in the mother board 11. The screw 22a is tightened in the threaded hole 20 of the main line connection terminal 5b, thereby bringing the head of the screw 22a into firm contact with the first land 22a and establishing an electrical connection between the first land 22 and the conductive rod 6b. It should be noted that the support piece 19 is optional and can be omitted.

Figure 9:
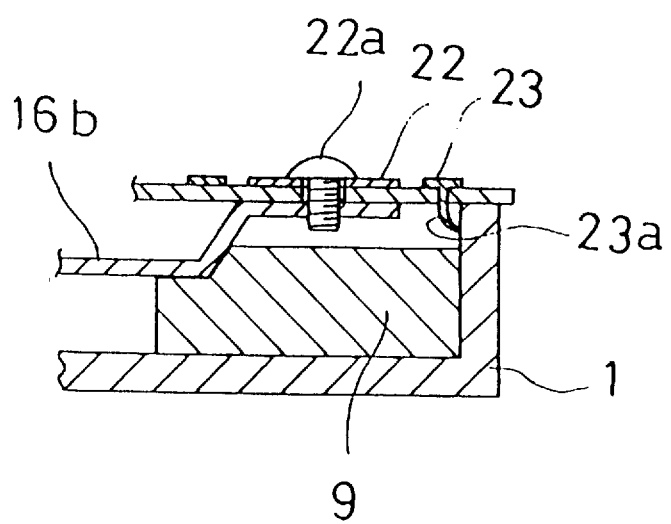
FIG. 9 is a cross sectional view illustrating how the main line connection terminal is connected to the mother board.

Provided outside the first land 22 is a circular second land 23 with a portion cut out of it. The second land 23 is insulated from the first land 22 and electrically connected to the housing 1 via contact pieces 23a projected from the rear surface of the mother board 11. Thus, the main line connection terminal 5b (5a, 5c) is coaxially connected to the transmission terminal 12 (see FIG. 9).

Also, the mother board 11 has a pair of engaging slits 24 formed therein outside the relay terminals 13.

Reference numeral 25 designates a box-shaped branch unit which has on one surface a pair of connection terminals 26 and 26' which correspond to the relay terminals 13 of the mother board 11. The branch unit 25 has on the opposite surface a branch terminal 27. The connection terminals 26 and 26' and the branch terminal 27 are connected to a built-in branch circuit. With the connection terminal 26 serving as the input terminal and the connection terminal 26' serving as the output terminal, the branch unit 25 can convey high-frequency signals in a predetermined direction. It also has on both ends thereof two engaging claws 28 projected toward the surface where the connection terminals 26 and 26' are located. When the branch unit 25 is mounted on the mother board 11 by engaging the claws 28 with the slits 24, the connection terminals 26 and 26' are brought into contact with the relay terminals 13.

The branch unit on the mother board may be mounted by some other method. For example, the engaging claws formed on the branch unit may be replaced with guide lugs which are inserted into the slits formed in the mother board. Furthermore, screws or clips may be employed as the means of mounting the branch unit on the mother board.

The mother board 11 is provided with a push switch 29. When the branch unit 25 is mounted on the mother board 11, the outer surface of the branch unit 25 presses against and turns off the switch 29. When the branch unit 25 is detached from the board mother 6, the push switch 29 is released from the pressure of the unit 25 and turned on, thus short-circuiting the relay terminals 13 and allowing passage of high-frequency signals between the transmission terminals 12.

Moreover, the current transmission circuit 15 of the mother board 11 ensures that currents and high-frequency signals flow between the transmission terminals 12 whether or not the branch unit 25 is mounted on the mother board 11.

Reference numeral 30 is a tap board mounted on the inner surface of a main body 31. Together with the housing 1, the main body 1 constitutes the entire case of the distribution apparatus. The tap board 30 includes a distributing circuit and four external taps 32 exposed on the outer surface of the main body 31. The external taps 32 serve as distribution output terminals. The tap board 30 also has on its inner surface an input terminal 33 corresponding to the branch terminal 27 of the branch unit 25. Additionally, the housing 1 is provided with a current passage contact 34 which is connected to the cable connecting portion 2 while the main body 31 is provided with another current passage contact 35 which is connected to the distributing circuit. Therefore, currents can be transmitted through these two contacts. The current passage contact 34 is connected to the external taps 32 via a current passage network 36 provided on the tap board 30. By fitting the main body 31 on the housing 1, the branch terminal 27 is brought into contact with the input terminal 33. At the same time, an electrical contact is also established between the current passage contacts 34 and 35, thereby forming a separate current passing route from the high-frequency passing route.

Figure 10:
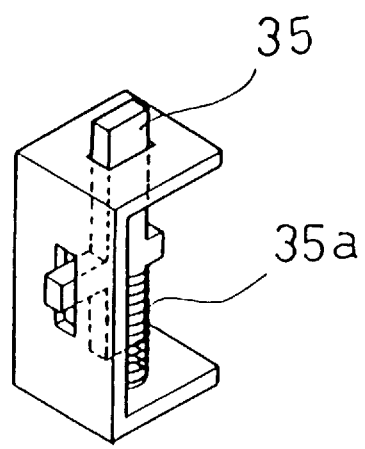
FIG. 10 shows the current passage contact of the embodiment.
Figure 11A:
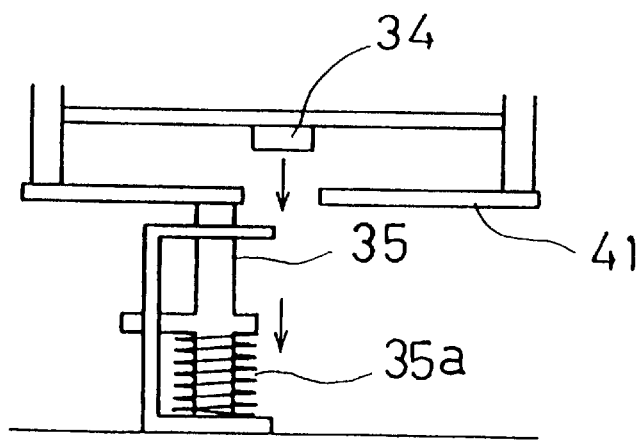
FIGS. 11A and 11B shows the current passage contact in two states.
Figure 11B:
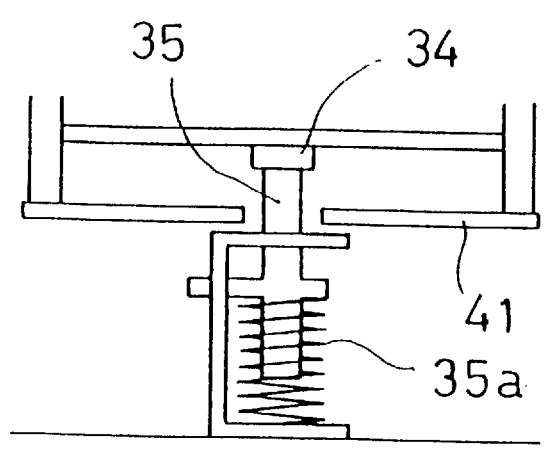

As shown in FIG. 10, the current passage contact 35 is of a pin type biased toward the tip thereof by a coil spring 35a. The current passage contact 35, if shifted off the insertion-type current passage contact 34, moves back while compressing the coil spring 35, thus preventing breakage (see FIG. 11A). However, when the housing 1 is moved with respect to the main body 31 to align the two contacts, the contact 35 projects forward to reestablish an electrical contact (see FIG. 11B).

A positive thermistor 37 (model name: Polyswitch RXE0675; manufactured by Reikem) is interposed between the contact 35 and each distribution output terminal via a connector 38 in the current passage network 36. The positive thermistors 37 can be easily coupled to and detached with a single motion from the connectors 38 (model name: VH series connector; manufactured by Nippon Solderless Terminal Corporation).

The right and the left fitting ends of the housing 1 and the main body 31 have different shapes so that the housing and the body can be assembled in only one way. Assembly is possible only when a lug 39 projected from the housing 1 is inserted into a groove 40 formed in the main body 31. In this way, whenever the housing and the body are assembled, left-to-right inverted assembly is prevented while a secure electrical contact is established between the current passage contacts 34 and 35.

The current passage contact 34 is connected to the split tube of the cable connecting portion 3 via a current passage cable 34a. Normally, the upper surface of the current passage contact 34 is covered with a protection plate 41 which has a terminal insertion hole 41a to prevent the worker from accidentally touching the contact 34 and receiving an electric shock while at work.

Figure 12A:
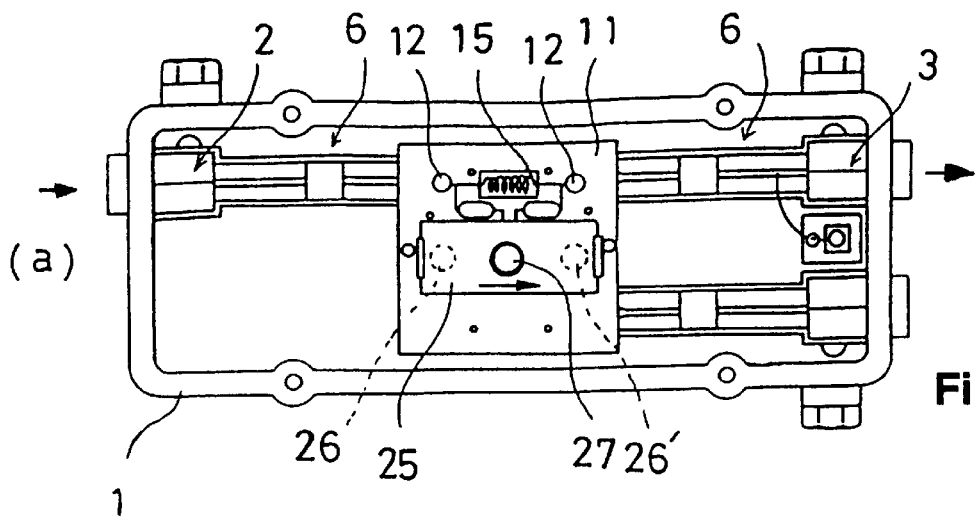
FIGS. 12A, 12B, and 12C show different pairs of cable connecting portions for use as terminals.

As shown in FIG. 12A, the multi-tap distribution apparatus can be used as an aerial type device if the branch unit 25 is mounted on the mother board 11 with the terminal 26 on the same side as the cable connecting portion 2 and the terminal 26' on the same side as the cable connecting portion 3. In this case, the cable connecting portion 2 is used as the input, terminal while the cable connecting portion 3 is used as the output terminal.

Figure 12B:
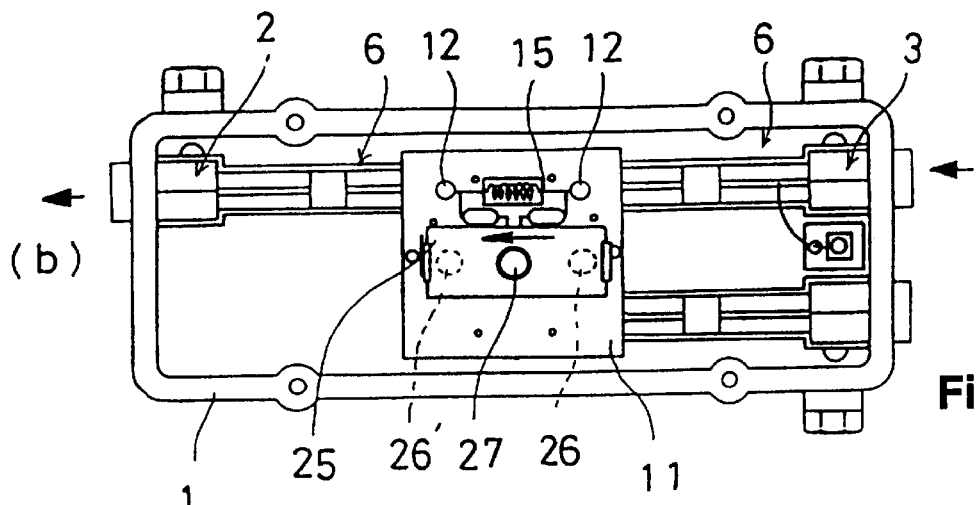

The positions of the input and output terminals can be easily reversed by detaching and horizontally rotating the branch unit 180 degrees and mounting it back on the mother board 11 (see FIG. 12B).

Figure 12C:
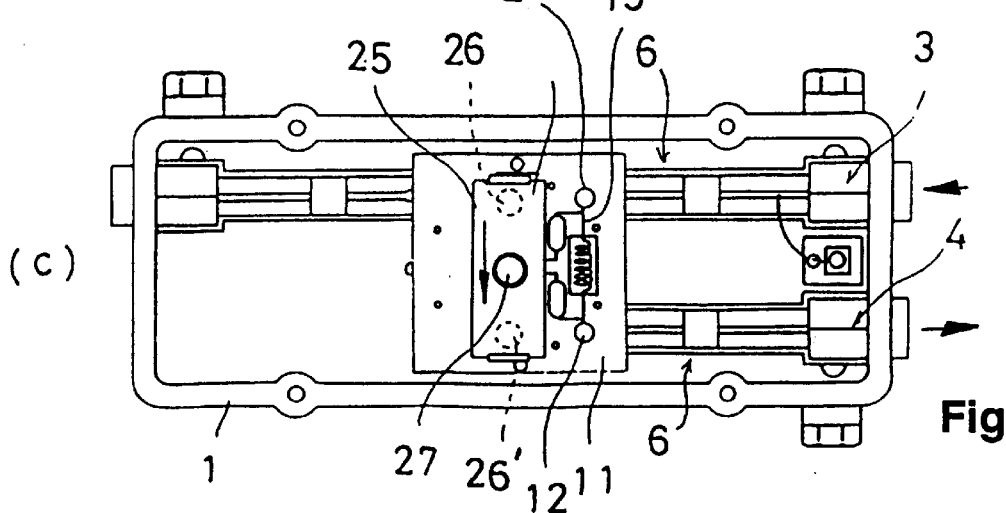

To use the multi-tap distribution apparatus as a pedestal type device, the mother board 11 is detached and rotated 90 degrees in clockwise direction as shown in FIG. 12C, so that the connection terminals 26 and 26' are connected with the main line connection terminals 5b and 5c via the transmission terminals 12. In this application, the cable connecting portion 3 serves as the input terminal and the cable connecting portion 4 as the output terminal. The positions of the input and output terminals can be easily reversed as in the aerial type application: by detaching and rotating the branch unit 25 one hundred and eighty degrees and mounting it back on the mother board 11 (this position is not shown).

To change the number of branches (secondary cables), the main body 31, the tap board 30, and the branch unit 25 are replaced with a different main body incorporating a tap board having a desired number of taps and a different branch unit.

To perform such a replacement, the branch unit 25 can be easily detached by disengaging the claws 28 from the slits 24. Upon detachment of the branch unit 25, the switch 29 is turned on, thus short-circuiting the transmission terminals 12 and maintaining high-frequency signal transmission between the cable connecting portions. Accordingly, the high-frequency signal transmission remains uninterrupted while the branch unit 25 is replaced.

In this embodiment, different cable connecting portions can be selected for use as the input and output terminals by rotating the mother board 90 degrees. Also, the number of taps can be increased or decreased by replacing the branch unit and the main body. Not only does this construction improve the operability of the multi-tap distribution apparatus, but it also allows the multi-tap distribution apparatus to be used as an aerial or pedestal type. Moreover, the multi-tap distribution apparatus offers the advantage of maintaining the check function from a remote site even when the branch unit or the main body is removed since the transmission of the currents and the high-frequency signals from the input side to the output side remains uninterrupted.

If the transmission cable is used as a telephone line, telephone conversations are not interrupted by using the current transmission circuit and the telephone line as the telephone uses signals in the low-frequency range.

If a short circuit occurs on the distribution output terminal side, the resistance of the positive thermistor included in the current passage network increases from tenths of an ohm to several kilo ohms, thus blocking the current flow between the cable connecting portion and the distribution output terminal. This protects the circuits in the distribution apparatus while preventing damage to equipment and devices connected to the transmission cable. This structure can be safely used in applications where currents of 15 amperes or more are conveyed.

As explained above, the high-frequency transmission circuit (branch circuit) is installed separately from the current passage network and a positive thermistor is connected to each distribution output terminal. Therefore, if a short circuit occurs, the current flow is interrupted only to the concerned branch output terminal while maintaining transmission of the television signals.

Since a positive thermistor is detachably connected to each external tap, it is possible to leave installed the positive thermistors for the external taps connected to the subscribers using telephone lines for receiving CATV services. Meanwhile, the power supply can be easily stopped to non-subscribers by removing from the connectors the positive thermistors for the external taps which are connected to non-subscribers. Not only can this operation be simply done but also it is easy to recognize to which externals taps currents are carried.

Alternatively, the same result can be obtained by providing switches (not shown) in the current passage network and selectively turning on and off the switches instead of detaching positive thermistors as explained above.

Furthermore, the multi-tap distribution apparatus may have only two cable connecting portions instead of three as in this embodiment. Furthermore, the number of taps may be either increased or decreased; the main body may have any number of taps.

As described above, the embodiment includes three main line connection terminals on the inner surface of the housing. Two of the terminals are located above and on both sides of the center of the housing while the third terminal is located directly under one of the upper terminals. Accordingly, the pair of main line connection terminals of the mother board to be connected with the transmission terminals can be selected by rotating the mother board. Instead of this construction, equally spaced pairs of main line connection terminals may be arranged on the housing so that the transmission terminals are connected to any desired pair of main line connection terminals by shifting the mother board. However, the present invention is applicable to the types of models in which main line connection terminals cannot be selected for connection or the number of external taps cannot be changed.

If only protection of the components and equipment from short circuits is desired, only one positive thermistor needs to be interposed in the current passage network near the main line connection terminal.

In accordance with the present invention, the number of slits in a split tube or the shape of the grip block may be freely changed. Similarly, screw access holes may be provided in other positions than the longitudinal sides of the housing 1.

EFFECT OF THE INVENTION

According to the invention, a transmission line can be easily connected to the distribution apparatus with a connector. The pin of the connector, as being inserted in the split tube and securely gripped in a block securing recess, is prevented from slipping out, causes a relatively small transmission loss, and can carry large currents without causing problems.

Moreover, the grip blocks are accessible for tightening from the outside through the screw access holes to eliminate the necessity for opening the case to connect cables to the distribution apparatus.

Furthermore, as a pair of cable connecting portions can be selectable from a plurality of portions, a single distribution apparatus can be used as either an aerial or pedestal type apparatus.

Also, as support grooves are formed in the surfaces of the grip blocks that come into contact with the split tube, the pin can be inserted without damaging the split tube. In order to render the apparatus completely waterproof, each of the screw access holes is plugged with a blind bolt.

I claim:

1. A distribution apparatus for being interposed in a transmission cable, said distribution apparatus comprising,
    a built-in mother board disposed in the approximate center of a case, said mother board including,
        a branch circuit for distributing as output signals high-frequency signals received at an input terminal of said mother board,
        a current transmission circuit for allowing currents to be transmitted between said input terminal and an output terminal of said mother board, and
        said input and output terminals of said mother board being electrically connected by means of transmission lines to cable connecting portions provided on corners of said case,
    wherein a pair of grip blocks positioned in each cable connecting portion grips and supports an end portion of a split tube secured to one end of one of said transmission lines with an open end of said split tube directed to one of connector insertion holes formed in said case, one of each pair of grip blocks are provided with a screw for being tightened in the direction for gripping said split tube, and screw access holes are formed in walls of said case.

2. The distribution apparatus in accordance with claim 1 wherein at least three cable connecting portions are provided so that two cable connecting portions are selectable from said at least three cable connecting portions for connection to said mother board.

3. The distribution apparatus in accordance with claim 1 wherein support grooves are formed in the surfaces of said grip blocks that come into contact with said split tube.

4. The distribution apparatus in accordance with claim 1 wherein said screw access holes are plugged with blind bolts.

5. The distribution apparatus in accordance with claim 2 wherein support grooves are formed in the surfaces of said grip blocks that come into contact with said split tube.

6. The distribution apparatus in accordance with claim 2 wherein said screw access holes are plugged with blind bolts.

7. The distribution apparatus in accordance with claim 3 wherein said screw access holes are plugged with blind bolts.

* * * * *